United States Patent
Shin et al.

Patent Number: 5,879,984
Date of Patent: Mar. 9, 1999

[54] METHODS FOR FABRICATING CAPACITOR STRUCTURES USING A PHOTORESIST LAYER

[75] Inventors: Yun-seung Shin, Seoul; Jong-jin Lee, Kyungki-do, both of Rep. of Korea

[73] Assignee: Samsung Electronics Co., Ltd., Suwon, Rep. of Korea

[21] Appl. No.: 806,791

[22] Filed: Feb. 26, 1997

[30] Foreign Application Priority Data

Feb. 28, 1996 [KR] Rep. of Korea .......... 96-5096

[51] Int. Cl.[6] .............................. H01L 21/8242
[52] U.S. Cl. ............................ 438/253; 438/254
[58] Field of Search ................. 438/250–256, 438/390–398

[56] References Cited

U.S. PATENT DOCUMENTS 5,330,614  7/1994  Ahn ........................ 156/631
5,668,038  9/1997  Huang et al. ............ 438/396
5,716,882  2/1998  Tseng .

Primary Examiner—Jey Tsai
Attorney, Agent, or Firm—Myers Bigel Sibley & Sajovec

[57] ABSTRACT

A method for fabricating an electrode structure of an integrated circuit device comprises the following steps. Initially, a conductive layer is formed on a substrate. A photoresist layer is formed on the conductive layer, wherein said photoresist layer includes a hole exposing a portion of said conductive layer. A portion of the conductive layer is then etched to a predetermined thickness that is less than a thickness of the conductive layer using said photoresist layer as an etching mask. The hole in the photoresist layer is enlarged by removing a portion of the photoresist layer, thereby exposing a surface portion of the conductive layer outside the etched portion of the conductive layer. An insulating layer is then formed on the surface portion of the conductive layer and the etched portion of the first conductive layer. The insulating layer is used as an etching mask for etching the conductive layer to form an electrode structure.

18 Claims, 5 Drawing Sheets

METHODS FOR FABRICATING CAPACITOR STRUCTURES USING A PHOTORESIST LAYER

FIELD OF THE INVENTION

The present invention relates to methods for fabricating integrated circuit devices, and more particularly, to methods for fabricating capacitor structures for integrated circuit devices.

BACKGROUND OF THE INVENTION

In integrated circuit fabrication, the reduction of memory cell capacitance due to a decrease in the area of a memory cell may hinder higher integration of dynamic random access memories (DRAMs). Furthermore, a reduction in memory cell capacitance may lower the readout capability, increase the soft error rate, and make low voltage operation difficult. Thus, it would be desirable to reduce the size of the memory cell in order to achieve the high integration of integrated circuit devices without significantly decreasing the memory cell capacitance.

It is known that the charge Q stored in a capacitor is determined by multiplying the capacitance C of the capacitor by the capacitor's operating voltage V. This relationship can be expressed by the equation Q=C*V. The capacitance C of a capacitor can be expressed as $C=A\epsilon_o\epsilon_r/D$, where A is the effective area of the capacitor, $\epsilon_o$ is the dielectric constant of the capacitor's dielectric in a vacuum state, $\epsilon_r$ is the relative dielectric constant of the capacitor's dielectric, and D is the thickness of the capacitor's dielectric. Thus, the capacitance C of the capacitor can be increased by increasing the effective area A of the capacitor, increasing the dielectric constant $\epsilon_r$ of the dielectric, and/or decreasing the thickness D of the dielectric.

As a result, lower electrodes having a three-dimensional structure have been proposed to increase the effective area of the capacitor. Examples of three-dimensional lower electrode structures include a fin-shaped lower electrode, a box structure lower electrode and a cylindrical-shaped lower electrode. Of particular significance is the cylindrical lower electrode which is widely used because the inner surface and the outer surface of the cylinder portion of the electrode can be used to increase effective surface area.

FIGS. 1 to 5 are cross-sectional views illustrating steps of a conventional method for fabricating a capacitor having a cylindrical lower electrode. FIG. 1 shows the steps of forming an insulating layer 20 and a conductive layer 30. As shown, a first insulating layer 20 of borophosphosilicate glass (BPSG) is formed to a thickness of about 2000 Å on a semiconductor substrate 10. The first insulating layer 20 is then patterned to form a contact hole that exposes a predetermined area of the semiconductor substrate 10. The conductive layer 30 is formed on the insulating layer 20 to a thickness of about 7000 Å, thereby filling the contact hole. The conductive layer can be a layer of polysilicon.

FIG. 2 shows the steps of forming a photoresist pattern 40 and a spacer 50. Specifically, a photoresist layer is formed on the conductive layer 30 and is patterned to expose the conductive layer 30, thereby forming the photoresist pattern 40 on the conductive layer 30 opposite the contact hole. Because the conductive layer 30 is exposed when the photoresist layer is patterned, the photoresist layer should be overexposed.

When the photoresist layer is overexposed to form the photoresist pattern 40, however, a smaller pattern than desired may be formed. With reference to FIG. 2, the photoresist pattern 40 may have a width narrower than that of the desired pattern. Because the portion of the conductive layer 30 where the photoresist pattern 40 is formed is the area defining the inner surface of the lower electrode, as the width of the photoresist pattern 40 narrows due to the overexposure, the inner diameter of the lower electrode may likewise decrease. The effective surface area of the electrode may thus decrease, and therefore, the capacitance of the capacitor may be reduced.

Next, a second insulating layer of a silicon oxide is formed on the photoresist pattern 40 and the conductive layer 30. The second insulating layer is preferably formed at a relatively low temperature between 300 and 450° C. so that the photoresist pattern 40 is not significantly damaged. The second insulating layer is then anisotropically etched to form the spacer 50 on the sidewall of the photoresist pattern 40, as shown in FIG. 2.

FIG. 3 shows the step of forming a modified conductive layer 30a. In particular, using the photoresist pattern 40 and the spacer 50 as etching masks, the conductive layer 30 is etched to a predetermined thickness that does not expose the insulating layer pattern 20. Thus, the modified conductive layer 30a is formed, as shown in FIG. 3.

FIG. 4 shows the steps of forming a modified spacer 50a and a lower electrode 30b. First, the photoresist pattern 40 is removed through an ashing process. Residues generated by the ashing process can be removed using an etching solution, such as a sulfuric acid solution. This process may also partially remove the spacer 50 so that the size of the spacer 50 is diminished, thereby forming the modified spacer 50a. The modified conductive layer 30a is then etched using the modified spacer 50a as an etching mask to expose the insulating layer pattern 20 at the outer edge of the modified spacer 50a, thereby forming the cylindrical lower electrode 30b.

As described above, the width of the spacer 50 may be reduced when the photoresist pattern 40 is removed. Therefore, an upper portion A of the sidewall of the lower electrode 30b may also be etched so that a step may be formed in the sidewall of the lower electrode 30b. This may result in a pattern failure in the lower electrode 30b.

FIG. 5 shows the steps of forming a modified insulating layer 20a, a dielectric layer 60, and an upper electrode 70. First, the modified spacer 50a is removed using a buffered oxide etchant (BOE). A portion of the insulating layer pattern 20 is also removed with the modified spacer 50a so as to expose a bottom portion of the lower electrode 30b, thereby forming the modified insulating layer 20a.

The dielectric layer 60 is then deposited to a thickness of about 50 Å on the lower electrode 30b and the modified insulating layer 20a. The dielectric layer 60, however, may be improperly formed on the lower electrode 30b because of the step at the upper portion A of the sidewall. The upper electrode 70 is then formed on the dielectric layer 60, thereby completing a cylindrical capacitor. The upper electrode can be a layer of polysilicon.

According to a conventional method described above for fabricating cylindrical capacitor, the photoresist pattern 40 may be narrower in width than desired if the photoresist layer is overexposed when forming the photoresist pattern 40. By narrowing the width of the photoresist pattern 40, the effective area of the capacitor may be reduced, thus reducing the capacitance of the capacitor. Moreover, an undesirable pattern failure may occur in the lower electrode 30b when the photoresist pattern 40 is removed because the spacer 50 is also partially removed.

SUMMARY OF THE INVENTION

It is therefore an object of the present invention to provide improved methods for fabricating integrated circuit capacitors and related structures.

It is another object of the present invention to provide methods for forming cylindrical capacitor structures which can increase the effective area of the lower electrode.

It is yet another object of the present invention to provide methods for forming integrated circuit capacitors and related structures which can reduce a pattern failure of the lower electrode.

These and other objects are provided according to the present invention by methods for forming electrode structures including the following steps. Initially, a conductive layer is formed on a substrate, and a photoresist layer is then formed on the conductive layer. A hole exposing the conductive layer is then formed in the photoresist layer, and the exposed portion of the conductive layer is etched to a predetermined thickness that is less than the thickness of the conductive layer, using the photoresist layer as an etching mask. The hole in the photoresist layer is then enlarged by removing a portion of the photoresist layer which exposes a surface portion of the conductive layer outside the etched portion of the conductive layer. An insulating layer is formed in the hole and is used as an etching mask for etching the photoresist layer and the first conductive layer so as to form an electrode structure. Accordingly, the size of the surface area of the electrode structure may be increased if the photoresist layer is overexposed when forming the hole therein. Further, steps in the outer sidewall of the upper portion of the electrode structure can be reduced because the outer sidewall of the electrode structure is defined by the insulating layer.

This method can also include the steps of removing the insulating layer, forming a dielectric layer on the electrode structure, and forming a second conductive layer on the dielectric layer. These steps may complete a capacitor structure. In addition, the step of forming the conductive layer can be preceded by the steps of forming a second insulating layer on the substrate, and forming a contact hole in the second insulating layer to expose a portion of the substrate, thereby electrically connecting the conductive layer to the substrate through the contact hole. The step of etching the first conductive layer to form the electrode structure can be preceded by the step of removing the photoresist layer, preferably by an ashing process. Further, the step of etching the first conductive layer to form an electrode structure preferably includes anisotropically etching the first conductive layer to expose the first insulating layer.

In addition, the step of forming the insulating layer in the hole can include the steps of depositing an insulating material in the hole at a temperature of about 300–450° C., and then etching the insulating material to expose the photoresist layer. Further, the insulating layer can be a layer of silicon dioxide, the first conductive layer can be a layer of polysilicon, and the second insulating layer can be a layer of borophosphosilicate glass (BPSG).

The methods and structures of the present invention can thus be used to provide electrode structures for memory cell capacitors having an increased effective area of the capacitor and reduced pattern failure in the lower electrode.

DETAILED DESCRIPTION OF THE PREFERRED EMBODIMENTS

Figure 1:
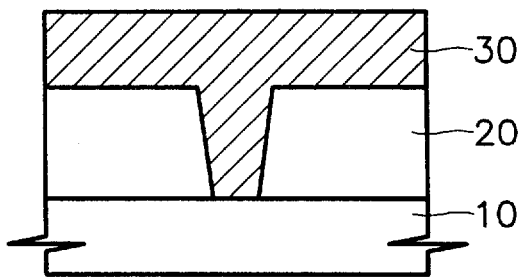
FIGS. 1 to 5 are cross-sectional views illustrating steps of a method for fabricating capacitors of an integrated circuit device according to the prior art.
Figure 2:
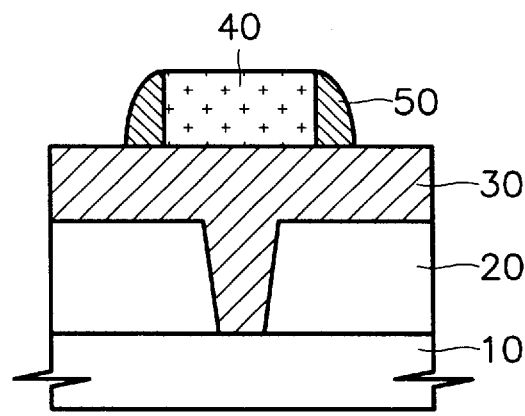
Figure 3:
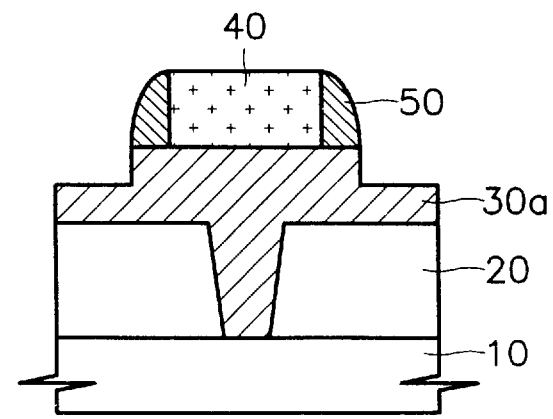
Figure 4:
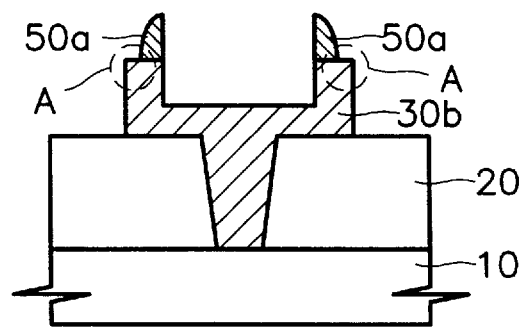
Figure 5:
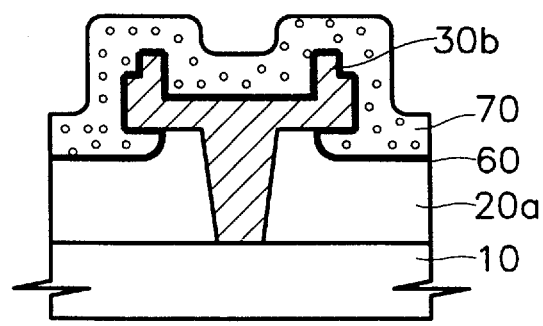

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thicknesses of the layers and regions are exaggerated for clarity, and are not drawn to scale. Further, like reference numerals designate like elements throughout.

Figure 6:
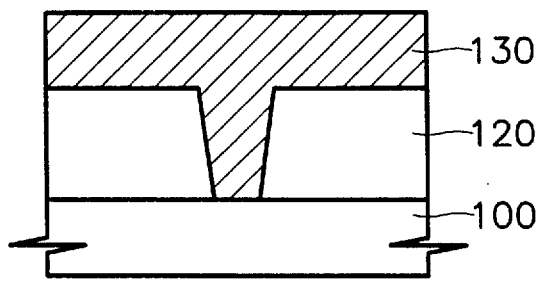
FIGS. 6 to 12 are cross-sectional views illustrating steps of a method for fabricating capacitors of an integrated circuit device according to the present invention.

FIG. 6 shows the steps of forming a first insulating layer 120 and a first conductive layer 130. Particularly, the first insulating layer 120 is formed on a semiconductor substrate 100 utilizing a first insulating material which can be a layer of borophosphosilicate glass (BPSG). The first insulating layer 120 is preferably formed to a thickness of about 2000 Å. Next, the first insulating layer 120 is patterned to form a contact hole that exposes a predetermined area of the semiconductor substrate 100. The first conductive layer 130 is then formed on the first insulating layer 120, thereby filling the hole and forming an electrical connection between the first conductive layer 130 and the semiconductor substrate 100. The first conductive layer 130 is preferably formed to a thickness of about 6500 to 7500 Å and can be a layer of doped polysilicon.

Figure 7:
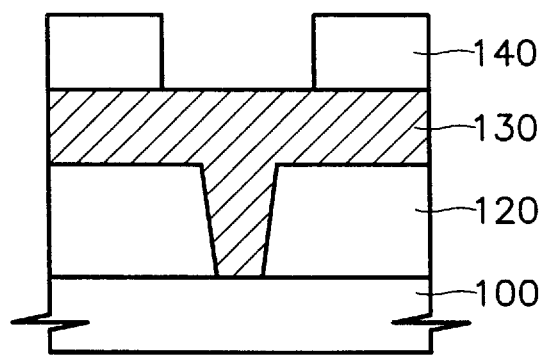

FIG. 7 shows the steps of forming a photoresist layer 140. Initially, a layer of photoresist is formed on the first conductive layer 130. The photoresist is then patterned to expose a predetermined area of the first conductive layer 130 opposite the contact hole. The photoresist can be overexposed to ensure that the predetermined area of the first conductive layer 130 is adequately exposed. Overexposure, however, generally will not reduce the diameter of the inner surface of the resulting lower electrode structure.

The exposed area of the first conductive layer 130 can be increased by any overexposure of the photoresist layer 140. Because the exposed portion of the first conductive layer 130 defines the inner surface of the cylindrical electrode structure that is later formed, over exposing the photoresist can increase the inner diameter of the cylindrical lower electrode. Moreover, the effective surface area of the electrode may be likewise increased by any increase in the inner diameter of the cylindrical lower electrode.

Figure 8:
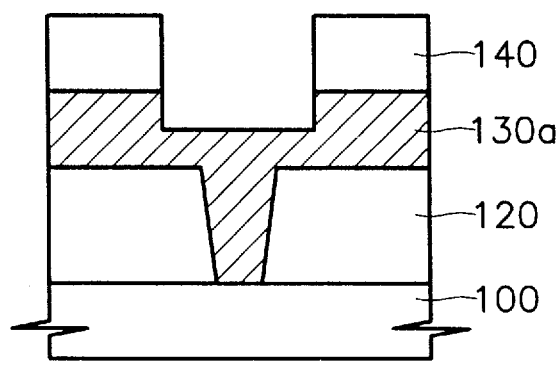

FIG. 8 shows the steps of forming a modified first conductive layer 130a having a hole. Using the photoresist layer 140 as an etching mask, the first conductive layer 130 is time-etched to a predetermined thickness that does not expose the first insulating layer 120. Thus, the modified first conductive layer 130a is formed, as shown in FIG. 8.

Figure 9:
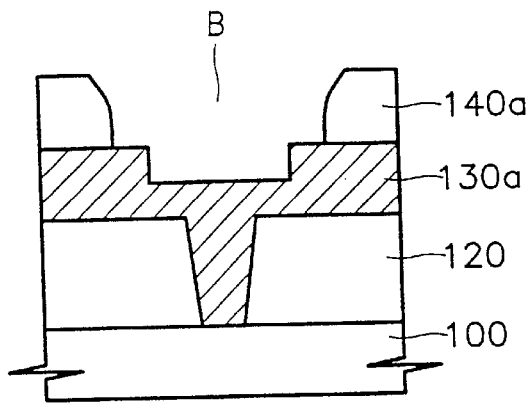

FIG. 9 shows the step of forming a modified photoresist layer 140a. Specifically, the modified photoresist layer 140a is formed by partially etching the photoresist layer 140 to expose a surface portion of the modified first conductive layer 130a outside the etched portion of the modified first conductive layer 130a. A hole B is thus formed in the modified first conductive layer 130a and the modified photoresist layer 140a. As shown in FIG. 9, this results in the hole B having a stepped sidewall formed by a first diameter defined by the modified first conductive layer 130a and a second diameter defined by the modified photoresist layer 140a, whereby the second diameter is greater than the first diameter.

It will be understood that the amount of photoresist layer 140 that is etched away to form the modified photoresist layer 140a generally determines the width of the sidewall and the size of the outer diameter of the lower electrode formed from the conductive layer 130a. Generally, the more of the photoresist layer 140 that is removed, the wider the sidewall and the larger the outer diameter of the lower electrode. Consequently, if the width of the sidewall and the outer diameter of the lower electrode are increased, then the effective surface area of the capacitor is also generally increased. If the photoresist pattern 140 is etched too far, however, then the lower electrodes may become too wide and may be short-circuited with adjacent lower electrodes. Therefore, any over etching which occurs when forming the modified photoresist layer 140a should preferably be kept within an appropriate range.

Figure 10:
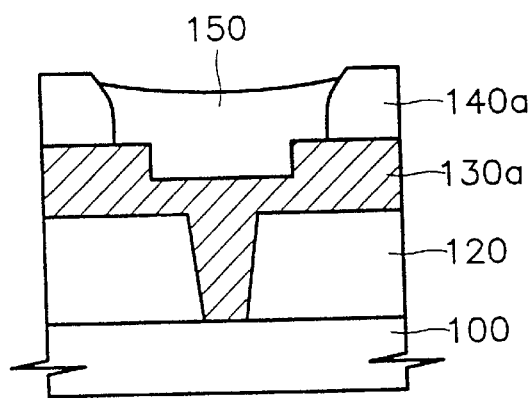

FIG. 10 shows the step of forming a second insulating layer 150. A second insulating layer of an insulating material is formed over the modified photoresist layer 140a, thereby filling the hole B. The second insulating layer is formed at a relatively low temperature in the range of about 300 to 450° C. to reduce damage to the modified photoresist layer 140a. The second insulating layer can be a layer of silicon dioxide. The second insulating layer is then etched to expose the modified photoresist layer pattern 140a, thereby forming the second insulating layer 150.

Figure 11:
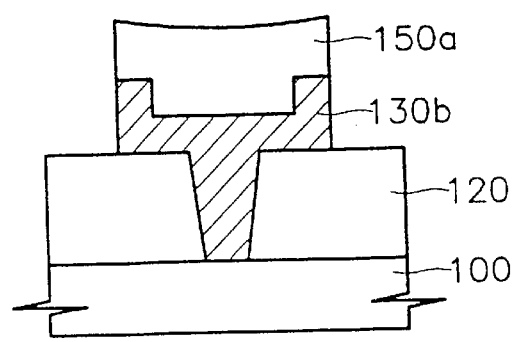

FIG. 11 shows the step of forming a lower electrode 130b. First, the modified photoresist layer 140a is removed through an ashing process. Any residues generated by the ashing process can be removed using an etching solution, such as a sulfuric acid solution. The second insulating layer 150 is also partially removed in the etching solution, thereby forming a modified second insulating layer 150a. Using the modified second insulating layer 150a as an etching mask, the modified first conductive layer 130a is anisotropically etched to expose the first insulating layer 120. As a result, the lower electrode 130b is formed, as shown in FIG. 11.

The modified second insulating layer 150a defines the outer surface of the upper portion of the lower electrode 130b. Thus, significant steps are not formed in the upper portion of the sidewall of the lower electrode 130b. Accordingly, pattern failures can be reduced in the lower electrode 130b.

Figure 12:
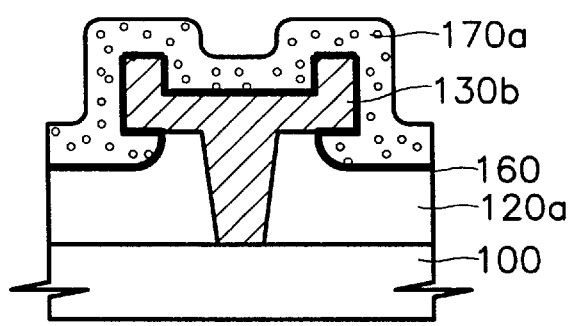

FIG. 12 shows the steps of forming a dielectric layer 160 and an upper electrode 170. Initially, the modified second insulating layer 150a is removed. A portion of the first insulating layer 120 can also be removed, thereby forming a modified first insulating layer 120a that partially exposes the bottom portion of the lower electrode 130b. The dielectric layer 160 is then formed on the modified first insulating layer 120a and the lower electrode 130b. Thereafter, the upper electrode 170 is formed on the dielectric layer 160, thereby completing the formation of the cylindrical capacitor. The upper electrode can be a layer of doped polysilicon.

As described above, the photoresist layer 140 exposes a portion of the first conductive layer 130a on which the inner portion of the lower electrode is to be formed. Therefore, even though the photoresist 140 may be overexposed, the effective area of the capacitor need not be significantly reduced. Also, even though the modified second insulating layer 150a is formed by removing a portion of the second insulating layer 150 when the modified photoresist 140a is removed, the modified second insulating layer 150a defines a new etching surface. In particular the modified second insulating layer 150a defines the outer surface of the cylinder-shaped upper portion of the lower electrode 130b. Accordingly, a step generally is not formed on the outer sidewall of the upper portion of the lower electrode 130b.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method for fabricating an electrode structure of an integrated circuit device, comprising the steps of:

forming a conductive layer on a substrate;

forming a first masking layer on said conductive layer, wherein said first masking layer includes a hole exposing a portion of said conductive layer;

etching said portion of said conductive layer to a predetermined thickness that is less than a thickness of said conductive layer using said first masking layer as an etching mask;

enlarging said hole in said first masking layer by removing a portion of said first masking layer, thereby exposing a surface portion of said conductive layer outside said etched portion of said conductive layer;

forming a second masking layer on said exposed surface portion of said conductive layer and on said etched portion of said conductive layer;

removing said first masking layer; and etching said first conductive layer using said second masking layer as an etching mask to form an electrode structure.

2. The method of claim 1, further comprising the steps of:

removing said second masking layer;

forming a dielectric layer on said electrode structure; and forming a second conductive layer on said dielectric layer to thereby form an integrated circuit capacitor.

3. The method of claim 1, wherein the step of forming said conductive layer is preceded by the steps of:

forming an insulating layer on said substrate; and forming a contact hole in said insulating layer to expose a portion of said substrate, and wherein said step of forming said conductive layer comprises the steps of forming a portion of said conductive layer in said hole to electrically connect said conductive layer to said substrate through said hole.

4. The method of claim 1, wherein said first masking layer comprises a photoresist layer.

5. The method of claim 1, wherein said second masking layer comprises an insulating layer.

6. The method of claim 1, wherein said first conductive layer is comprised of polysilicon.

7. The method of claim 1, wherein said second masking layer is comprised of silicon dioxide.

8. The method of claim 7, wherein the step of forming said second masking layer comprises the steps of depositing an insulating material at a temperature of about 300 to 450° C., and etching said insulating material to expose said first masking layer.

9. The method of claim 1, wherein the step of etching said first conductive layer to form said electrode structure includes the step of anisotropically etching said first conductive layer.

10. The method of claim 1, wherein the step of removing said first masking layer includes the step of ashing said first masking layer.

11. A method for fabricating a capacitor for an integrated circuit, comprising the steps of:

forming an insulating layer on a substrate;

forming a contact hole in said insulating layer to expose a portion of said substrate, forming a first conductive layer on said insulating layer, whereby said first conductive layer is electrically connected to said substrate through said contact hole;

forming a first masking layer on said conductive layer, wherein said first masking layer includes a hole exposing a portion of said first conductive layer opposite said contact hole;

etching said portion of said first conductive layer a predetermined thickness that is less than a thickness of said first conductive layer using said first masking layer as an etching mask;

enlarging said hole in said first masking layer by removing a portion of said first masking layer, thereby exposing a surface portion of said first conductive layer outside said etched portion of said first conductive layer;

forming a second masking layer on said exposed surface portion of said first conductive layer and on said etched portion of said first conductive layer;

removing said first masking layer;

etching said first conductive layer using said second masking layer as an etching mask form an electrode structure;

removing said second masking layer;

forming a dielectric layer on said electrode structure; and forming a second conductive layer on said dielectric layer.

12. The method of claim 11, wherein said insulating layer comprises borophosphosilicate glass (BPSG).

13. The method of claim 11, wherein said second masking layer comprises silicon oxide.

14. The method of claim 13, wherein the step of forming said second masking layer comprises the steps of depositing and baking an insulating material at a temperature of about 300 to 450° C., and etching said insulating material to expose said first masking layer.

15. The method of claim 11, wherein the step of etching said first conductive layer to form said electrode structure includes the step of anisotropically etching said first conductive layer.

16. The method of claim 11, wherein the step of removing said first masking layer includes the step of ashing said first masking layer.

17. The method of claim 11, wherein said first masking layer comprises a photoresist layer.

18. The method of claim 11, wherein said second masking layer comprises a second insulating layer.

* * * * *